United States Patent
Chae

(10) Patent No.: US 11,900,988 B2
(45) Date of Patent: Feb. 13, 2024

(54) ELECTRONIC DEVICE RELATED TO A PRECHARGE OPERATION

(71) Applicant: SK hynix Inc., Icheon-si (KR)

(72) Inventor: Haeng Seon Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 118 days.

(21) Appl. No.: 17/726,847

(22) Filed: Apr. 22, 2022

(65) Prior Publication Data

US 2023/0245693 A1    Aug. 3, 2023

(30) Foreign Application Priority Data

Feb. 3, 2022    (KR) .................. 10-2022-0014495

(51) Int. Cl.
    *G11C 11/4094*    (2006.01)
    *G11C 11/4076*    (2006.01)

(52) U.S. Cl.
    CPC ...... *G11C 11/4094* (2013.01); *G11C 11/4076* (2013.01)

(58) Field of Classification Search
    CPC ............ G11C 11/4094; G11C 11/4076; G11C 11/4087; G11C 8/10; G11C 8/12; G06F 3/0659
    USPC .................................................... 365/230.03
    See application file for complete search history.

(56) References Cited

U.S. PATENT DOCUMENTS

| | | | |
|---|---|---|---|
| 7,113,446 B2 | 9/2006 | Fujisawa | |
| 2008/0158129 A1* | 7/2008 | Murakami | ........... G09G 3/3688 345/98 |
| 2022/0351765 A1* | 11/2022 | Song | ..................... G06F 7/5443 |

FOREIGN PATENT DOCUMENTS

| | | | | |
|---|---|---|---|---|
| JP | 6535784 B1 * | 6/2019 | ......... G11C 11/4063 |
| KR | 20160094469 A * | 8/2016 | |
| KR | 1020210079122 A | 6/2021 | |

\* cited by examiner

*Primary Examiner* — Fernando Hidalgo
(74) *Attorney, Agent, or Firm* — William Park & Associates Ltd.

(57) ABSTRACT

An electronic device may include: a clock divider circuit configured to generate a first internal clock including pulses which are generated in synchronization with odd pulses of a clock, and generate a second internal clock including pulses which are generated in synchronization with even pulses of the clock; and a command decoder configured to generate an odd precharge command and an even precharge command based on a counting signal which is toggled by a chip selection signal and a command/address signal for performing a precharge operation in synchronization with the first internal clock or toggled by the chip selection signal and the command/address signal for performing the precharge operation in synchronization with the second internal clock.

20 Claims, 15 Drawing Sheets

FIG. 4

| OPERATION | CS | CA<1> | CA<2> | CA<3> | CA<4> | CA<5> | CA<6> | CA<7> | CA<8> | CA<9> |
|---|---|---|---|---|---|---|---|---|---|---|
| ACTIVE | L | L | L | ROW<1> | ROW<2> | ROW<3> | CA<6> | CA<7> | CA<8> | CA<9> |
|  | H | ROW<4> | ROW<5> | ROW<6> | ROW<7> | ROW<8> | ROW<9> | ROW<10> | ROW<11> | ROW<12> |
| WRITE | L | H | L | H | H | L | BA<1> | BA<2> | BG<1> | BG<2> |
|  | H | COL<1> | COL<2> | COL<3> | COL<4> | COL<5> | COL<6> | COL<7> | COL<8> | COL<9> |
| READ | L | H | L | H | H | H | BA<1> | BA<2> | BG<1> | BG<2> |
|  | H | COL<1> | COL<2> | COL<3> | COL<4> | COL<5> | COL<6> | COL<7> | COL<8> | COL<9> |
| REFRESH | L | H | H | L | L | H | X | X | X | X |
| 1st PRECHARGE (SAME BANK) | L | H | H | L | H | L | BA<1> | BA<2> | X | H |
| 2nd PRECHARGE (ONE BANK) | L | H | H | L | H | H | BA<1> | BA<2> | BG<1> | BG<2> |
| 3rd PRECHARGE (ALL BANK) | L | H | H | L | H | L | X | X | X | L |

ELECTRONIC DEVICE RELATED TO A PRECHARGE OPERATION

CROSS-REFERENCES TO RELATED APPLICATIONS

The present application claims priority under 35 U.S.C. § 119(a) to Korean application number 10-2022-0014495, filed in the Korean Intellectual Property Office on Feb. 3, 2022, the entire disclosure of which is incorporated herein by reference in its entirety.

BACKGROUND

1. Technical Field

Various embodiments of the present disclosure relate to an electronic device, and more particularly to an electronic device related to precharge operations.

2. Related Art

In general, an electronic device including a DDR SDRAM (Double Data Rate Synchronous DRAM) performs a data read/write operation according to a command input from an external chip set. In order to perform such a read/write operation, the electronic device needs to perform an active operation and a precharge operation. The electronic device generates an internal command and an internal address signal for performing the active operation and the precharge operation according to a command/address signal input through a command address pin, and distinguishes between a command and an address which are consecutively input, by using a chip selection signal.

The frequency of a clock is increased for the electronic device to operate at high speed. With the increase in frequency of the clock, a generation error may occur in internal commands, due to a command and address which are consecutively input in synchronization with the clock. Thus, a variety of methods are suggested to prevent the generation error.

SUMMARY

In an embodiment, an electronic device may include: a clock divider circuit configured to generate a first internal clock including pulses which are generated in synchronization with odd pulses of a clock, and generate a second internal clock including pulses which are generated in synchronization with even pulses of the clock; and a command decoder configured to generate an odd precharge command and an even precharge command based on a counting signal which is toggled by a chip selection signal and a command/address signal for performing a precharge operation in synchronization with the first internal clock or toggled by the chip selection signal and the command/address signal for performing the precharge operation in synchronization with the second internal clock. The command decoder may be configured to generate a pulse of the odd precharge command as a pulse corresponding to two or more periods of the clock, and generate a pulse of the even precharge command as a pulse corresponding to two or more periods of the clock.

In another embodiment, an electronic device may include: a command decoder configured to generate an odd precharge command and an even precharge command based on a counting signal which is toggled by a chip selection signal and a command/address signal for performing a first precharge operation and a second precharge operation in synchronization with a first internal clock or toggled by the chip selection signal and the command/address signal for performing the first and second precharge operations in synchronization with a second internal clock; and a core circuit configured to perform the first precharge operation on banks at the same positions, which are included in a first bank group and a second bank group, according to an internal address signal generated from the command/address signal when any one of the odd precharge command and the even precharge command is input, or perform the second precharge operation on one of a plurality of banks included in the first and second bank groups according to the internal address signal generated from the command/address signal when any one of the odd precharge command and the even precharge command is input. The command decoder may be configured to generate a pulse of the odd precharge command as a pulse corresponding to two or more periods of a clock, and generate a pulse of the even precharge command as a pulse corresponding to two or more periods of the clock.

BRIEF DESCRIPTION OF THE DRAWINGS

FIG. 4 is a table for describing an operation of a command decoder included in the electronic device illustrated in FIG. 2.

DETAILED DESCRIPTION

Figure 1:
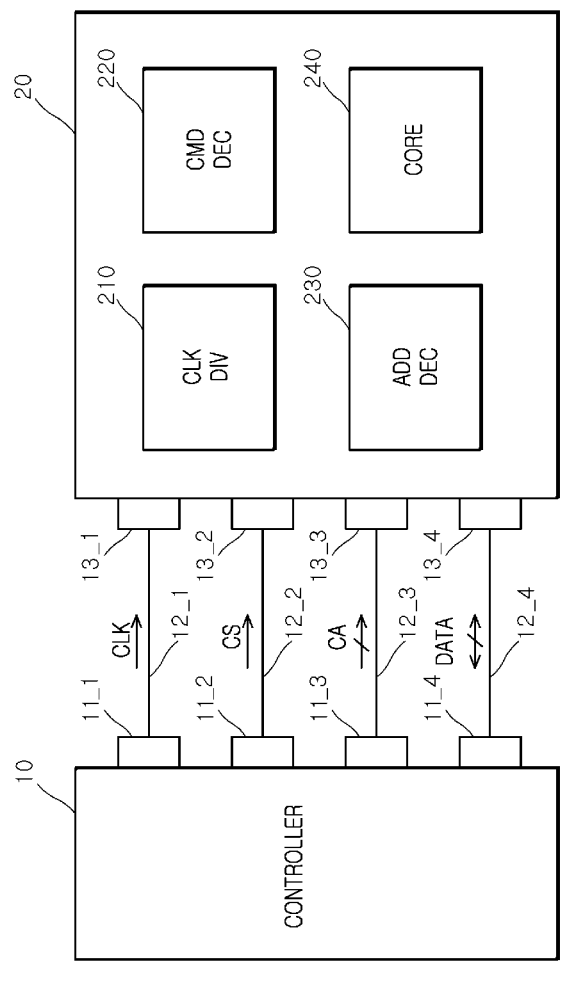
FIG. 1 is a block diagram illustrating a configuration of a semiconductor system in accordance with an embodiment.

The term "preset" indicates that the value of a parameter is previously decided, when the parameter is used in a process or algorithm. According to an embodiment, the value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it may indicate that the components may be directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having a "logic high level" is distinguished from a signal having a "logic low level." For example, when a signal having a first voltage corresponds to "logic high level," a signal having a second voltage may correspond to "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, teachings of the present disclosure will be described in more detail through embodiments. The embodiments are only used to exemplify the teachings of the present disclosure, and the scope of the present disclosure is not limited by the embodiments.

Embodiments of the present disclosure are directed to an electronic device which can generate pulses of a precharge command as pulses each corresponding to two periods (2tck) or more of a clock, when command/address signals for performing a precharge operation are consecutively input, thereby preventing or mitigating the pulses of the precharge command from being merged even though loadings of command transmission lines are changed.

In accordance with some embodiments, the electronic device may generate pulses of the precharge command as pulses each corresponding to two periods (2tck) or more of the clock, when the command/address signals for performing the precharge operation are consecutively input, thereby preventing or mitigating the pulses of the precharge command from being merged even though loadings of the command transmission lines are changed.

Furthermore, the electronic device may generate pulses of the precharge command as pulses each corresponding to two periods (2tck) or more of the clock, when the command/address signals for performing the precharge operation are consecutively input, thereby preventing or mitigating a precharge operation error.

As illustrated in FIG. 1, a semiconductor system 1 in accordance with an embodiment may include a controller 10 and an electronic device 20.

The controller 10 may include a first control pin 11_1, a second control pin 11_2, a third control pin 11_3, and a fourth control pin 11_4. The electronic device 20 may include a first electronic pin 13_1, a second electronic pin 13_2, a third electronic pin 13_3, and a fourth electronic pin 13_4.

The controller 10 may transmit a clock CLK to the electronic device 20 through a first transmission line 12_1 coupled between the first control pin 11_1 and the first electronic pin 13_1. The clock CLK may be set to a signal which is periodically toggled to synchronize operations of the controller 10 and the electronic device 20. The controller 10 may transmit a chip selection signal CS to the electronic device 20 through a second transmission line 12_2 coupled between the second control pin 11_2 and the second electronic pin 13_2. The controller 10 may transmit a command/address signal CA to the electronic device 20 through a third transmission line 12_3 coupled between the third control pin 11_3 and the third electronic pin 13_3. The third control pin 11_3, the third transmission line 12_3, and the third electronic pin 13_3 may be each implemented as a plurality of pins or lines according to the number of bits contained in the command/address signal CA. The controller 10 may transmit data DATA to the electronic device 20 or receive the data DATA from the electronic device 20, through a fourth transmission line 12_4 coupled between the fourth control pin 11_4 and the fourth electronic pin 13_4. The fourth control pin 11_4, the fourth transmission line 12_4, and the fourth electronic pin 13_4 may be each implemented as a plurality of pins or lines according to the number of bits contained in the data DATA.

The controller 10 may output the clock CLK, the chip selection signal CS, and the command/address signal CA for controlling the operation of the electronic device 20. The controller may output the chip selection signal CS and the command/address signal CA which have a logic level combination for controlling an active operation, a write operation, a read operation, a refresh operation, and a precharge operation of the electronic device 20. The controller 10 may output the data DATA which is to be stored in the electronic device 20, during the write operation. The controller 10 may receive the data DATA output from the electronic device 20 during the read operation.

The electronic device 20 may include a clock divider circuit 210, a command decoder 220, an address decoder 230, and a core circuit 240.

The clock divider circuit 210 may generate a first internal clock (CKA of FIG. 2) and a second internal clock (CKB of FIG. 2) based on the clock CLK. The clock divider circuit 210 may generate the first internal clock (CKA of FIG. 2) and the second internal clock (CKB of FIG. 2), which are out of phase with one another, and by dividing the frequency of the clock CLK the first and second internal clocks CKA and CKB may be, for example, 180 degrees out of phase with one another. The clock divider circuit 210 may generate the first internal clock (CKA of FIG. 2) including pulses which are generated in synchronization with odd pulses of the clock CLK. The clock divider circuit 210 may generate the second internal clock (CKB of FIG. 2) including pulses which are generated in synchronization with even pulses of the clock CLK.

Figure 2:
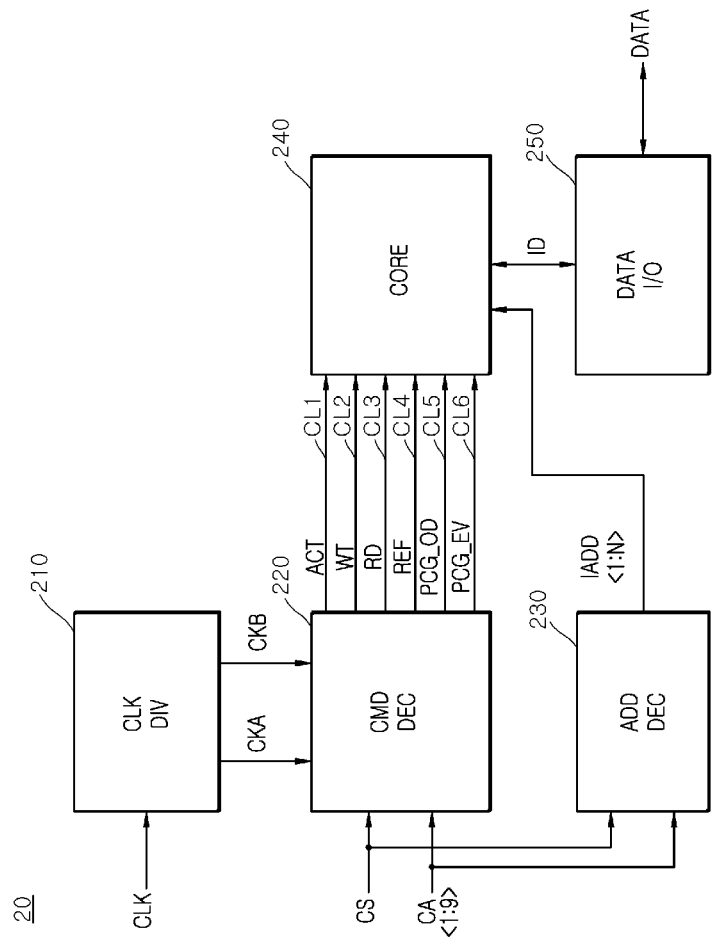
FIG. 2 is a block diagram illustrating a configuration of an electronic device included in the semiconductor system illustrated in FIG. 1.

The command decoder 220 may generate an odd precharge command (PCG_OD of FIG. 2) and an even precharge command (PCG_EV of FIG. 2) based on a counting signal (PG_C of FIG. 6) which is toggled by the chip selection signal CS and the command/address signal CA for performing a precharge operation in synchronization with the first internal clock (CKA of FIG. 2) or toggled by the chip selection signal CS and the command/address signal CA for performing a precharge operation in synchronization with the second internal clock (CKB of FIG. 2).

The address decoder 230 may generate an internal address signal (IADD<1:N> of FIG. 2) by decoding the chip selection signal CS and the command/address signal CA.

The core circuit 240 may perform a first precharge operation on banks at the same positions, included in first to fourth bank groups (BG1 to BG4 of FIG. 11), according to the internal address signal (IADD<1:N> of FIG. 2) generated from the command/address signal CA, when any one of the odd precharge command (PCG_OD of FIG. 2) and the even precharge command (PCG_EV of FIG. 2) is input. The core circuit 240 may perform a second precharge operation on any one of a plurality of banks included in first to fourth bank groups (BG1 to BG4 of FIG. 11), according to the internal address signal (IADD<1:N> of FIG. 2) generated from the command/address signal CA, when any one of the odd precharge command (PCG_OD of FIG. 2) and the even precharge command (PCG_EV of FIG. 2) is input. The first precharge operation may be set to a precharge operation on banks at the same positions, included in the first to fourth bank groups (BG1 to BG4 of FIG. 11). The second precharge operation may be set to a precharge operation on any one of the plurality of banks included in the first to fourth bank groups (BG1 to BG4 of FIG. 11). The precharge operation may be set to an operation of driving a bit line pair (BL,/BL of FIG. 12), coupled to a memory cell (MC of FIG. 12) included in a plurality of banks, to a bit line precharge voltage (VBLP of FIG. 12).

FIG. 2 is a block diagram illustrating a configuration based on an example of the electronic device 20 included in a semiconductor system 1. The electronic device 20 may include the clock divider circuit 210, the command decoder 220, the address decoder 230, the core circuit 240, and a data input/output circuit 250.

The clock divider circuit 210 may generate the first internal clock CKA and the second internal clock CKB based on the clock CLK. The clock divider circuit 210 may generate the first internal clock CKA and the second internal clock CKB, which are out of phase with one another, and by dividing the frequency of the clock CLK the first and second internal clocks CKA and CKB may be, for example, 180 degrees out of phase with one another. The clock divider circuit 210 may divide the frequency of the clock CLK, and generate the first internal clock CKA including pulses which are generated in synchronization with odd pulses of the clock CLK. The odd pulses of the clock CLK indicate a first pulse, a third pulse, a fifth pulse, . . . , among the pulses of the clock CLK which are periodically generated. The clock divider circuit 210 may divide the frequency of the clock CLK, and generate the second internal clock CKB including pulses which are generated in synchronization with even pulses of the clock CLK. The even pulses of the clock CLK indicate a second pulse, a fourth pulse, a sixth pulse, . . . , among the pulses of the clock CLK which are periodically generated.

The command decoder 220 may generate an active command ACT, a write command WT, a read command RD, a refresh command REF, an odd precharge command PCG_OD, and an even precharge command PCG_EV by decoding the chip selection signal CS, first to fifth command/address signals CA<1:5>, and a ninth command/address signal CA<9> in synchronization with the first internal clock CKA and the second internal clock CKB.

The command decoder 220 may generate the active command ACT based on the chip selection signal CS and the first and second command/address signals CA<1:2> for performing an active operation in synchronization with the first internal clock CKA and the second internal clock CKB. The command decoder 220 may generate the write command WT based on the chip selection signal CS and the first to fifth command/address signals CA<1:5> for performing a write operation in synchronization with the first internal clock CKA and the second internal clock CKB. The command decoder 220 may generate the read command RD based on the chip selection signal CS and the first to fifth command/address signals CA<1:5> for performing a read operation in synchronization with the first internal clock CKA and the second internal clock CKB. The command decoder 220 may generate the refresh command REF based on the chip selection signal CS and the first to fifth command/address signals CA<1:5> for performing a refresh operation in synchronization with the first internal clock CKA and the second internal clock CKB. The command decoder 220 may generate the odd precharge command PCG_OD and the even precharge command PCG_EV based on the counting signal (PG_C of FIG. 6) which is toggled by the chip selection signal CS, the first to fifth command/address signals CA<1:5>, and the ninth command/address signal CA<9> for performing a precharge operation in synchronization with the first internal clock CKA, or toggled by the chip selection signal CS, the first to fifth command/address signals CA<1:5>, and the ninth command/address signal CA<9> for performing a precharge operation in synchronization with the second internal clock (CKB of FIG. 2). The logic level combinations of the chip selection signal CS, the first to fifth command/address signals CA<1:5>, and the ninth command/address signal CA<9> for performing the active operation, the write operation, the read operation, the refresh operation, and the precharge operation will be described with reference to FIG. 4 which will be described below.

The command decoder 220 may generate the odd precharge command PCG_OD and the even precharge command PCG_EV according to the input points of the chip selection signal CS, the first to fifth command/address signals CA<1:5>, and the ninth command/address signal CA<9> for performing the precharge operation in synchronization with the first internal clock CKA and the second internal clock CKB. The command decoder 220 may generate a pulse of the odd precharge command PCG_OD as a pulse corresponding to two or more periods of the clock CLK. The command decoder 220 may generate a pulse of the even precharge command PCG_EV as a pulse corresponding to two or more periods of the clock CLK. The command decoder 220 may generate, as a pulse corresponding to three or more periods of the clock CLK, a pulse of the odd precharge command PCG_OD which is generated from the chip selection signal CS, the first to fifth command/address signals CA<1:5>, and the ninth command/address signal CA<9> which are input in synchronization with the first internal clock CKA, and a pulse of the odd precharge command PCG_OD which is generated from the chip selection signal CS, the first to fifth command/address signals CA<1:5>, and the ninth command/address signal CA<9> which are input in synchronization with the second internal clock CKB. The command decoder 220 may generate, as a pulse corresponding to three or more periods of the clock CLK, a pulse of the even precharge command PCG_EV which is generated from the chip selection signal CS, the first to fifth command/address signals CA<1:5>, and the ninth command/address signal CA<9> which are input in synchronization with the first internal clock CKA, and a pulse of the even precharge command PCG_EV which is generated from the chip selection signal CS, the first to fifth command/address signals CA<1:5>, and the ninth command/address signal CA<9> which are input in synchronization with the second internal clock CKB.

The command decoder 220 may output the active command ACT to the core circuit 240 through a first command transmission line CL1. The command decoder 220 may output the write command WT to the core circuit 240 through a second command transmission line CL2. The command decoder 220 may output the read command RD to the core circuit 240 through a third command transmission line CL3. The command decoder 220 may output the refresh command REF to the core circuit 240 through a fourth command transmission line CL4. The command decoder 220 may output the odd precharge command PCG_OD to the core circuit 240 through a fifth command transmission line CL5. The command decoder 220 may output the even precharge command PCG_EV to the core circuit 240 through a sixth command transmission line CL6.

Although the active command ACT, the write command WT, the read command RD, and the refresh command REF are each generated as one command, the precharge command may be generated as two commands, i.e. the odd precharge command PCG_OD and the even precharge command PCG_EV.

The address decoder 230 may generate first to Nth internal address signals IADD<1:N> by decoding the chip selection signal CS and the first to ninth command/address signals CA<1:9>. The logic level combination of the chip selection signal CS and the first to ninth command/address signals CA<1:9> for generating the first to Nth internal address signals IADD<1:N> will be described in detail with reference to FIG. 4 which will be described below.

The core circuit 240 may perform an active operation of activating a word line (WL of FIG. 12) selected by the first to Nth internal address signals IADD<1:N>, when the active command ACT is input. The core circuit 240 may perform a write operation of storing internal data ID, loaded on the bit line pair (BL,/BL of FIG. 12) selected by the first to Nth internal address signals IADD<1:N>, in the memory cell (MC of FIG. 12) when the write command WT is input. The core circuit 240 may perform a read operation of outputting the internal data ID, stored in the memory cell (MC of FIG. 12), to the bit line pair (BL,/BL of FIG. 12) selected by the first to Nth internal address signals IADD<1:N>, when the read command RD is input. The core circuit 240 may perform a refresh operation by sequentially activating a plurality of word lines (WL of FIG. 12) according to the first to Nth internal address signals IADD<1:N>, when the refresh command REF is input. The core circuit 240 may perform a precharge operation on a region selected by the first to Nth internal address signals IADD<1:N>, when any one of the odd precharge command PCG_ODD and the even precharge command PCG_EV is input.

The data input/output circuit 250 may generate the internal data ID from the data DATA input from the controller 10 and output the internal data ID to the core circuit 240, during the write operation. The data input/output circuit 250 may generate the data DATA from the internal data ID output from the core circuit 240 and output the data DATA to the controller 10, during the read operation.

The electronic device 20 may generate the pulses of the odd precharge command PCG_OD and the even precharge command PCG_EV as pulses each corresponding to two or more periods of the clock CLK, according to the input points of the chip selection signal CS and the first to fifth command/address signals CA<1:5> for performing the precharge operation. In an embodiment, by generating the pulses of the odd precharge command PCG_OD and the even precharge command PCG_EV as pulses each corresponding to two or more periods of the clock CLK, the electronic device 20 may prevent or mitigate the pulses of the odd precharge command PCG_OD and the even precharge command PCG_EV from being merged by loading of the command transmission line. In an embodiment, the electronic device 20 may secure a margin of the precharge operation by generating the pulses of the odd precharge command PCG_OD and the even precharge command PCG_EV as pulses each corresponding to two or more periods of the clock CLK.

Figure 3:
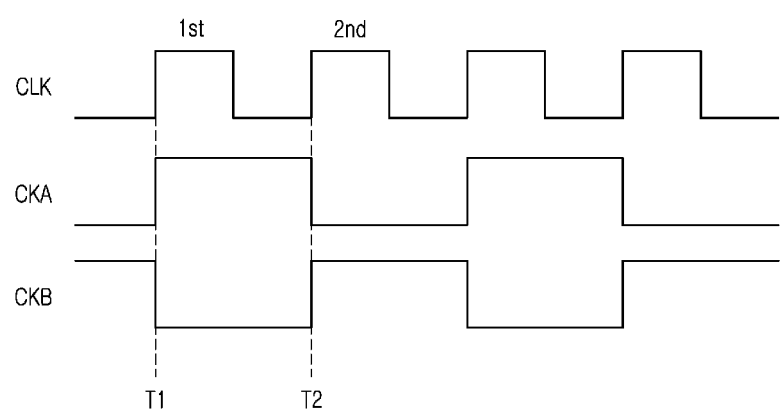
FIG. 3 is a timing diagram for describing an operation of a clock divider circuit included in the electronic device illustrated in FIG. 2.

FIG. 3 is a timing diagram for describing the operation of the clock divider circuit 210 in accordance with the present embodiment.

At time T1, the clock divider circuit 210 may generate the first internal clock CKA, including a pulse which is generated at a logic high level during one period of the clock CLK in synchronization with a first pulse 1st of the clock CLK. The first pulse 1st of the clock CLK may be set to an odd pulse of the clock CLK.

At time T2, the clock divider circuit 210 may generate the second internal clock CKB, including a pulse which is generated at a logic high level during one period of the clock CLK in synchronization with a second pulse 2nd of the clock CLK. The second pulse 2nd of the clock CLK may be set to an even pulse of the clock CLK.

As illustrated in FIG. 3, the clock divider circuit 210 may generate the first internal clock CKA and the second internal clock CKB, which are out of phase with one another, and by dividing the frequency of the clock CLK the first and second internal clocks CKA and CKB may be, for example, 180 degrees out of phase with one another. The clock divider circuit 210 may divide the frequency of the clock CLK, and generate the first internal clock CKA including pulses which are generated in synchronization with odd pulses of the clock CLK. The clock divider circuit 210 may divide the frequency of the clock CLK, and generate the second internal clock CKB including pulses which are generated in synchronization with even pulses of the clock CLK.

FIG. 4 is a diagram for describing the operations of the command decoder 220 and the address decoder 230 in accordance with the present embodiment.

The command decoder 220 may generate the active command ACT when the first command/address signal CA<1> is input as a logic low level and the second command/address signal CA<2> is input as a logic low level during a period in which the chip selection signal CS is at a logic low level.

The address decoder 230 may use the third to fifth command/address signals CA<3:5> as first to third row addresses ROW<1:3>, use the sixth and seventh command/address signals CA<6:7> as first and second bank addresses BA<1:2> for selecting first to fourth banks (BK1 to BK4 of FIG. 11), and use the eighth and ninth command/address signals CA<8:9> as first and second bank group addresses BG<1:2> for selecting the first to fourth bank groups (BG1 to BG4 of FIG. 11), during a period in which the chip selection signal CS is at a low logic level. The address decoder 230 may use the first to ninth command/address signals CA<1:9> as fourth to 12th row addresses ROW<4:12> during a period in which the chip selection signal CS is at a logic high level. The first to 12th row addresses ROW<1:12> may be set to addresses for selecting the plurality of word lines (WL of FIG. 12) included in the first to fourth banks (BK1 to BK4 of FIG. 11). The address decoder 230 may generate the first to Nth internal address signals IADD<1:N> by decoding the first and second bank group addresses BG<1:2>, the first and second bank addresses BA<1:2>, and the first to 12th row addresses ROW<1:12>.

The command decoder 220 may generate the write command WT when the first command/address signal CA<1> is input as a logic high level, the second command/address signal CA<2> is input as a logic low level, the third command/address signal CA<3> is input as a logic high level, the fourth command/address signal CA<4> is input as a logic high level, and the fifth command/address signal CA<5> is input as a logic low level, during a period in which the chip selection signal CS is at a logic low level.

The address decoder 230 may use the sixth and seventh command/address signals CA<6:7> as the first and second bank addresses BA<1:2> for selecting the first to fourth banks (BK1 to BK4 of FIG. 11), and use the eighth and ninth command/address signals CA<8:9> as the first and second bank group addresses BG<1:2> for selecting the first to fourth bank groups (BG1 to BG4 of FIG. 11), during a period in which the chip selection signal CS is at a low logic level. The address decoder 230 may use the first to ninth command/address signals CA<1:9> as first to ninth column addresses COL<1:9> during a period in which the chip selection signal CS is at a logic high level. The first to ninth column addresses COL<1:9> may be set to addresses for selecting a plurality of bit line pairs (BL,/BL of FIG. 12) included in the first to fourth banks (BK1 to BK4 of FIG. 11). The address decoder 230 may generate the first to Nth internal address signals IADD<1:N> by decoding the first and second bank group addresses BG<1:2>, the first and second bank addresses BA<1:2>, and the first to ninth column addresses COL<1:9>.

The command decoder 220 may generate the read command RD when the first command/address signal CA<1> is input as a logic high level, the second command/address signal CA<2> is input as a logic low level, the third command/address signal CA<3> is input as a logic high level, the fourth command/address signal CA<4> is input as a logic high level, and the fifth command/address signal CA<5> is input as a logic high level, during a period in which the chip selection signal CS is at a logic low level.

The address decoder 230 may use the sixth and seventh command/address signals CA<6:7> as the first and second bank addresses BA<1:2> for selecting the first to fourth banks (BK1 to BK4 of FIG. 11), and use the eighth and ninth command/address signals CA<8:9> as the first and second bank group addresses BG<1:2> for selecting the first to fourth bank groups (BG1 to BG4 of FIG. 11), during a period in which the chip selection signal CS is at a low logic level. The address decoder 230 may use the first to ninth command/address signals CA<1:9> as the first to ninth column addresses COL<1:9> during a period in which the chip selection signal CS is at a logic high level. The first to ninth column addresses COL<1:9> may be set to addresses for selecting the plurality of bit line pairs (BL,/BL of FIG. 12) included in the first to fourth banks (BK1 to BK4 of FIG. 11). The address decoder 230 may generate the first to Nth internal address signals IADD<1:N> by decoding the first and second bank group addresses BG<1:2>, the first and second bank addresses BA<1:2>, and the first to ninth column addresses COL<1:9>.

The command decoder 220 may generate the refresh command REF when the first command/address signal CA<1> is input as a logic high level, the second command/address signal CA<2> is input as a logic high level, the third command/address signal CA<3> is input as a logic low level, the fourth command/address signal CA<4> is input as a logic low level, and the fifth command/address signal CA<5> is input as a logic high level, during a period in which the chip selection signal CS is at a logic low level. Here, the sixth to ninth command/address signals CA<6:9> may be processed as don't care (X).

The address decoder 230 may generate the first to Nth internal address signals IADD<1:N> which are sequentially counted during the refresh operation.

The command decoder 220 may generate the odd precharge command PCG_OD and the even precharge command PCG_EV, when the first command/address signal CA<1> is input as a logic high level, the second command/address signal CA<2> is input as a logic high level, the third command/address signal CA<3> is input as a logic low level, the fourth command/address signal CA<4> is input as a logic high level, the fifth command/address signal CA<5> is input as a logic low level, and the ninth command address signal CA<9> is input as a logic high level, during a period in which the chip selection signal CS is at a logic low level. At this time, the odd precharge command PCG_OD and the even precharge command PCG_EV may be generated as commands for the first precharge operation. The first precharge operation may be set to a precharge operation on banks at the same positions, included in the first to fourth bank groups (BG1 to BG4 of FIG. 11). The precharge operation may be set to an operation of driving the bit line pair (BL,/BL of FIG. 12), coupled to the memory cell (MC of FIG. 12) included in the plurality of banks, to the bit line precharge voltage (VBLP of FIG. 12).

The address decoder 230 may use the sixth and seventh command/address signals CA<6:7> as the first and second bank addresses BA<1:2> for selecting the first to fourth banks (BK1 to BK4 of FIG. 11), during a period in which the chip selection signal Cs is at a logic low level. The address decoder 230 may generate the first to Nth internal address signals IADD<1:N> by decoding the first and second bank addresses BA<1:2>. At this time, the first to Nth internal address signals IADD<1:N> may be generated as a logic level combination for selecting banks at the same positions among the first to fourth banks BK1 to BK4 included in the first bank group BG1, the first to fourth banks BK1 to BK4 included in the second bank group BG2, the first to fourth banks BK1 to BK4 included in the third bank group BG3, and the first to fourth banks BK1 to BK4 included in the fourth bank group BG4. Here, the eighth command/address signal CA<8> may be processed as don't care (X).

The command decoder 220 may generate the odd precharge command PCG_OD and the even precharge command PCG_EV, when the first command/address signal CA<1> is input as a logic high level, the second command/address signal CA<2> is input as a logic high level, the third command/address signal CA<3> is input as a logic low level, the fourth command/address signal CA<4> is input as a logic high level, and the fifth command/address signal CA<5> is input as a logic high level, during a period in which the chip selection signal CS is at a logic low level. At this time, the odd precharge command PCG_OD and the even precharge command PCG_EV may be generated as commands for the second precharge operation. The second precharge operation may be set to a precharge operation on any one of the plurality of banks included in the first to fourth bank groups (BG1 to BG4 of FIG. 11).

The address decoder 230 may use the sixth and seventh command/address signals CA<6:7> as the first and second bank addresses BA<1:2> for selecting the first to fourth banks (BK1 to BK4 of FIG. 11), and use the eighth and ninth command/address signals CA<8:9> as the first and second bank group addresses BG<1:2> for selecting the first to fourth bank groups (BG1 to BG4 of FIG. 11), during a period in which the chip selection signal CS is at a low logic level. The address decoder 230 may generate the first to Nth internal address signals IADD<1:N> by decoding the first and second bank addresses BA<1:2> and the first and second bank group addresses BG<1:2>. At this time, the first to Nth internal address signals IADD<1:N> may be generated as a logic level combination for selecting any one of the first to fourth banks BK1 to BK4 included in each of the first to fourth bank groups BG1 to BG4.

The command decoder 220 may generate the odd precharge command PCG_OD and the even precharge command PCG_EV, when the first command/address signal CA<1> is input as a logic high level, the second command/address signal CA<2> is input as a logic high level, the third command/address signal CA<3> is input as a logic low level, the fourth command/address signal CA<4> is input as a logic high level, the fifth command/address signal CA<5> is input as a logic low level, and the ninth command address signal CA<9> is input as a logic low level, during a period in which the chip selection signal CS is at a logic low level. At this time, the odd precharge command PCG_OD and the even precharge command PCG_EV may be generated as commands for a third precharge operation. The third precharge operation may be set to a precharge operation on all of the banks included in the first to fourth bank groups (BG1 to BG4 of FIG. 11). The precharge operation may be set to an operation of driving the bit line pair (BL,/BL of FIG. 12), coupled to the memory cell (MC of FIG. 12) included in the plurality of banks, to the bit line precharge voltage (VBLP of FIG. 12). The sixth to eighth command/address signals CA<6:8> may be processed as don't care (X).

The first to fifth command/address signals CA<1:5> and the ninth command/address signal CA<9>, through which the command decoder 220 generates the active command ACT, the write command WT, the read command RD, the refresh command REF, the odd precharge command PCG_OD, and the even precharge command PCG_EV, may be set to a first group.

The first to ninth command/address signals CA<1:9> through which the address decoder 230 generates the first to Nth internal address signals IADD<1:N> may be set to a second group.

The first and second groups of the first to ninth command/address signals CA<1:9> may be set in various manners in different embodiments.

Figure 5:
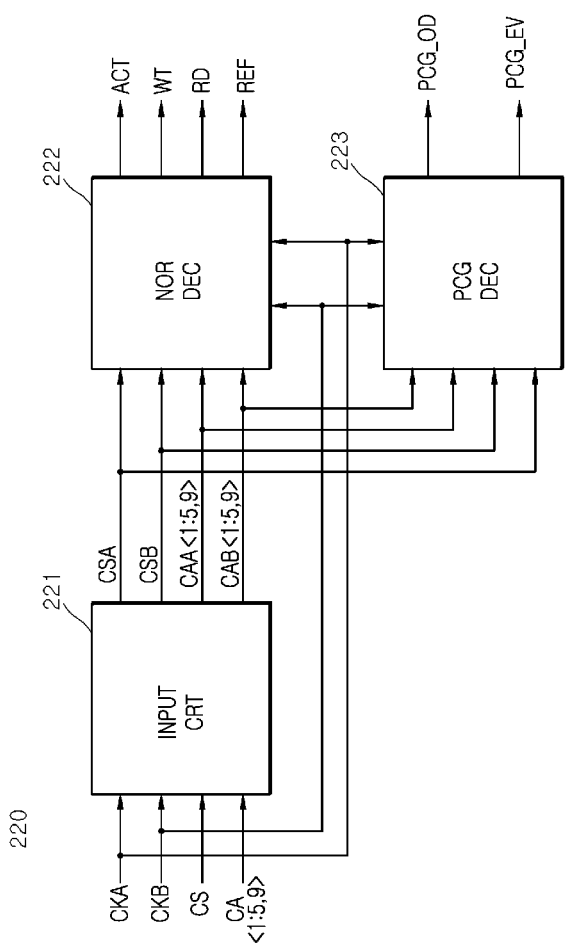
FIG. 5 is a block diagram illustrating a configuration of the command decoder included in the electronic device illustrated in FIG. 2.

FIG. 5 is a block diagram illustrating a configuration based on an example of the command decoder 220 included in the electronic device 20. The command decoder 220 may include an input circuit 221, a NORMAL DECODER 222, and a precharge decoder 223.

The input circuit 221 may generate an odd chip selection signal CSA, first to fifth odd command/address signals CAA<1:5>, and a ninth odd command/address signal CAA<9> based on the chip selection signal CS, the first to fifth command/address signals CA<1:5>, and the ninth command/address signal CA<9>, in synchronization with the first internal clock CKA. The input circuit 221 may latch the chip selection signal CS in synchronization with the first internal clock CKA, and generate the odd chip selection signal CSA by inverting the latched chip selection signal CS. The input circuit 221 may generate the first to fifth odd command/address signals CAA<1:5> and the ninth odd command/address signal CAA<9> by latching the first to fifth command/address signals CA<1:5> and the ninth command/address signal CA<9> in synchronization with the first internal clock CKA. The input circuit 221 may generate an even chip selection signal CSB, first to fifth even command/address signals CAB<1:5>, and a ninth even command/address signal CAB<9> based on the chip selection signal CS, the first to fifth command/address signals CA<1:5>, and the ninth command/address signal CA<9>, in synchronization with the second internal clock CKB. The input circuit 221 may latch the chip selection signal CS in synchronization with the second internal clock CKB, and generate the even chip selection signal CSB by inverting the latched chip selection signal CS. The input circuit 221 may generate the first to fifth even command/address signals CAB<1:5> and the ninth even command/address signal CAB<9> by latching the first to fifth command/address signals CA<1:5> and the ninth command/address signal CA<9> in synchronization with the second internal clock CKB.

The NORMAL DECODER 222 may generate the active command ACT when the odd chip selection signal CSA is input as a logic high level in synchronization with the first internal clock CKA and the first and second odd command/address signals CAA<1:2> have a logic level combination for performing the active operation. The NORMAL DECODER 222 may generate the active command ACT when the even chip selection signal CSB is input as a logic high level in synchronization with the second internal clock CKB and the first and second even command/address signals CAB<1:2> have a logic level combination for performing the active operation. The NORMAL DECODER 222 may generate the write command WT when the odd chip selection signal CSA is input as a logic high level in synchronization with the first internal clock CKA and the first to fifth odd command/address signals CAA<1:5> have a logic level combination for performing the write operation. The NORMAL DECODER 222 may generate the write command WT when the even chip selection signal CSB is input as a logic high level in synchronization with the second internal clock CKB and the first to fifth even command/address signals CAB<1:5> have a logic level combination for performing the write operation. The NORMAL DECODER 222 may generate the read command RD when the odd chip selection signal CSA is input as a logic high level in synchronization with the first internal clock CKA and the first to fifth odd command/address signals CAA<1:5> have a logic level combination for performing the read operation. The NORMAL DECODER 222 may generate the read command RD when the even chip selection signal CSB is input as a logic high level in synchronization with the second internal clock CKB and the first to fifth even command/address signals CAB<1:5> have a logic level combination for performing the read operation. The NORMAL DECODER 222 may generate the refresh command REF when the odd chip selection signal CSA is input as a logic high level in synchronization with the first internal clock CKA and the first to fifth odd command/address signals CAA<1:5> have a logic level combination for performing the refresh operation. The NORMAL DECODER 222 may generate the refresh command REF when the even chip selection signal CSB is input as a logic high level in synchronization with the second internal clock CKB and the first to fifth even command/address signals CAB<1:5> have a logic level combination for performing the refresh operation.

The precharge decoder 223 may generate the odd precharge command PCG_OD and the even precharge command PCG_EV when the odd chip selection signal CSA is input as a logic high level in synchronization with the first internal clock CKA, and the first to fifth odd command/address signals CAA<1:5> and the ninth odd command/address signal CAA<9> have a logic level combination for performing the first to third precharge operations. The precharge decoder 223 may generate the odd precharge command PCG_OD and the even precharge command PCG_EV when the even chip selection signal CSB is input as a logic high level in synchronization with the second internal clock CKB, and the first to fifth even command/address signals CAB<1:5> and the ninth even command/address signal CAB<9> have a logic level combination for performing the first to third precharge operations.

Figure 6:
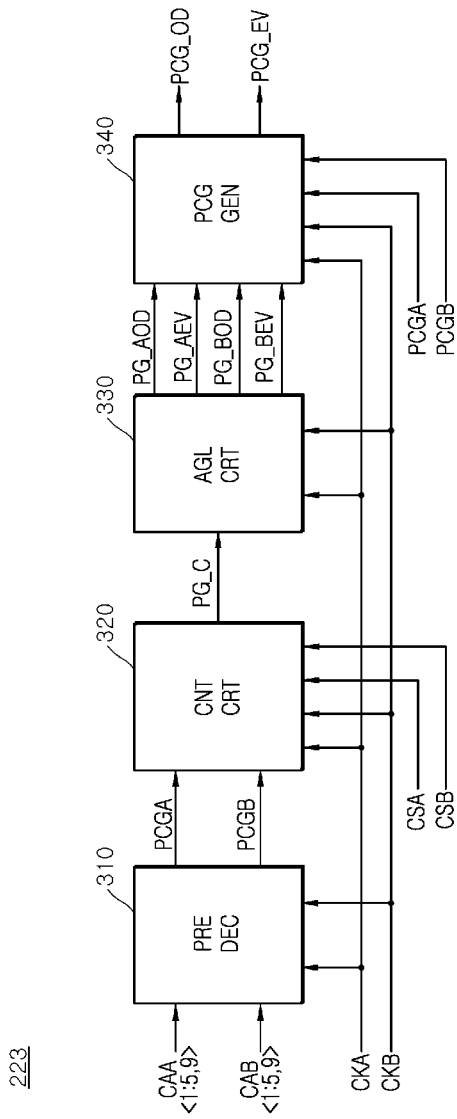
FIG. 6 is a block diagram illustrating a configuration of a precharge decoder included in the command decoder illustrated in FIG. 5.

FIG. 6 is a block diagram illustrating a configuration based on an example of the precharge decoder 223 included in the command decoder 220. The precharge decoder 223 may include a pre-decoder 310, a counting circuit 320, an alignment circuit 330, and a precharge command generation circuit 340.

The pre-decoder 310 may generate a first decoding signal PCGA in synchronization with the first internal clock CKA, when the first to fifth odd command/address signals CAA<1:5> and the ninth odd command/address signal CAA<9> have a logic level combination for performing the first to third precharge operations. The pre-decoder 310 may generate a second decoding signal PCGB in synchronization with the second internal clock CKB, when the first to fifth even command/address signals CAB<1:5> and the ninth even command/address signal CAB<9> have a logic level combination for performing the first to third precharge operations.

The counting circuit 320 may generate the counting signal PG_C which is toggled in synchronization with a rising edge of the first internal clock CKA during a period in which the odd chip selection signal CSA and the first decoding signal PCGA are input. The counting circuit 320 may generate the counting signal PG_C which is toggled in synchronization with a rising edge of the second internal clock CKB during a period in which the even chip selection signal CSB and the second decoding signal PCGB are input.

The alignment circuit 330 may generate a first precharge alignment signal PG_AOD and a second precharge alignment signal PG_AEV based on the counting signal PG_C in synchronization with a falling edge of the first internal clock CKA. The alignment circuit 330 may generate the first precharge alignment signal PG_AOD by latching the counting signal PG_C in synchronization with the falling edge of the first internal clock CKA, and generate the second precharge alignment signal PG_AEV by inverting the first precharge alignment signal PG_AOD. The alignment circuit 330 may generate a third precharge alignment signal PG_BOD and a fourth precharge alignment signal PG_BEV based on the counting signal PG_C in synchronization with a falling edge of the second internal clock CKB. The alignment circuit 330 may generate the third precharge alignment signal PG_BOD by latching the counting signal PG_C in synchronization with the falling edge of the second internal clock CKB, and generate the fourth precharge alignment signal PG_BEV by inverting the third precharge alignment signal PG_BOD.

The precharge command generation circuit 340 may generate the odd precharge command PCG_OD based on the first decoding signal PCGA, the first precharge alignment signal PG_AOD, and the third precharge alignment signal PG_BOD, in synchronization with a rising edge of the first internal clock CKA. The precharge command generation circuit 340 may generate the even precharge command PCG_EV based on the second decoding signal PCGB, the second precharge alignment signal PG_AEV, and the fourth precharge alignment signal PG_BEV, in synchronization with a rising edge of the second internal clock CKB.

Figure 7:
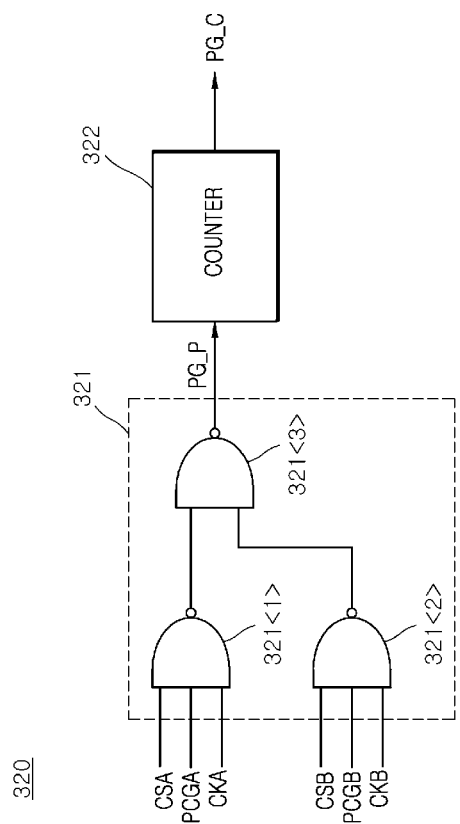
FIG. 7 is a diagram illustrating a configuration of a counting circuit included in the precharge decoder illustrated in FIG. 6.

FIG. 7 is a diagram illustrating a configuration based on an example of the counting circuit 320 included in the precharge decoder 223. The counting circuit 320 may include a logic circuit 321 and a counter 322.

The logic circuit 321 may be implemented as NAND gates 321<1>, 321<2>, and 321<3>. The NAND gate 321<1> may generate an output signal having a logic low level, when the odd chip selection signal CSA, the first decoding signal PCGA, and the first internal clock CKA are input as logic high levels. The NAND gate 321<2> may generate an output signal having a logic low level, when the even chip selection signal CSB, the second decoding signal PCGB, and the second internal clock CKB are input as logic high levels. The NAND gate 321<3> may generate a pulse signal PG_P having a logic high level, when any one of the output signals of the NAND gates 321<1> and 321<2> is at a logic low level.

The logic circuit 321 may generate the pulse signal PG_P having a logic high level, when the odd chip selection signal CSA, the first decoding signal PCGA, and the first internal clock CKA are input as logic high levels. The logic circuit 321 may generate the pulse signal PG_P having a logic high level, when the even chip selection signal CSB, the second decoding signal PCGB, and the second internal clock CKB are input as logic high levels.

The counter 322 may generate the counting signal PG_C which is toggled in synchronization with a pulse of the pulse signal PG_P. The counter 322 may generate the counting signal PG_C which is toggled when the pulse signal PG_P having a logic high level is input.

Figure 8:
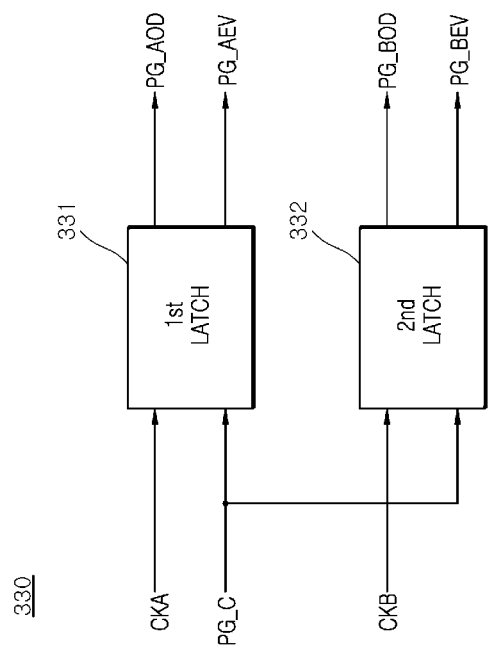
FIG. 8 is a block diagram illustrating a configuration of an alignment circuit included in the precharge decoder illustrated in FIG. 6.

FIG. 8 is a block diagram illustrating a configuration based on an example of the alignment circuit 330 included in the precharge decoder 223. The alignment circuit 330 may include a first latch circuit 331 and a second latch circuit 332.

The first latch circuit 331 may generate the first precharge alignment signal PG_AOD and the second precharge alignment signal PG_AEV based on the counting signal PG_C in synchronization with a falling edge of the first internal clock CKA. The first latch circuit 331 may latch the counting signal PG_C in synchronization with the falling edge of the first internal clock CKA, generate the first precharge alignment signal PG_AOD by inverting the latched counting signal PG_C, and generate the second precharge alignment signal PG_AEV by inverting the first precharge alignment signal PG_AOD.

The second latch circuit 332 may generate the third precharge alignment signal PG_BOD and the fourth precharge alignment signal PG_BEV based on the counting signal PG_C in synchronization with a falling edge of the second internal clock CKB. The second latch circuit 332 may latch the counting signal PG_C in synchronization with the falling edge of the second internal clock CKB, generate the third precharge alignment signal PG_BOD by inverting the latched counting signal PG_C, and generate the fourth precharge alignment signal PG_BEV by inverting the third precharge alignment signal PG_BOD.

Figure 9:
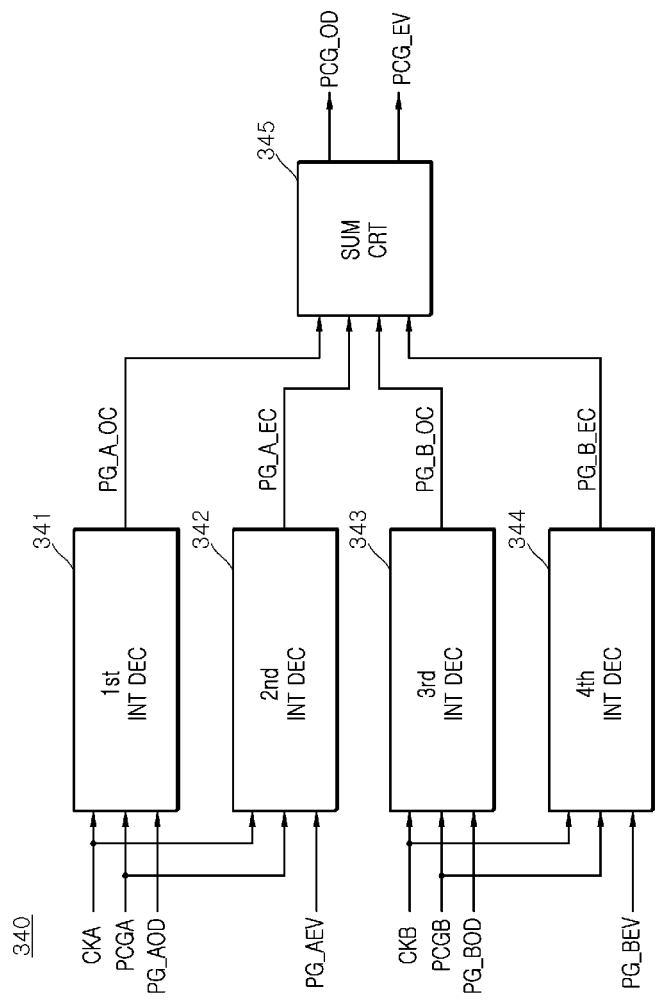
FIG. 9 is a block diagram illustrating a configuration of a precharge command generation circuit included in the precharge decoder illustrated in FIG. 6.

FIG. 9 is a block diagram illustrating a configuration based on an example of the precharge command generation circuit 340 included in the precharge decoder 223. The precharge command generation circuit 340 may include a first internal decoder 341, a second internal decoder 342, a third internal decoder 343, a fourth internal decoder 344, and a summing circuit 345.

The first internal decoder 341 may generate a first internal precharge signal PG_A_OC based on the first internal clock CKA, the first decoding signal PCGA, and the first precharge alignment signal PG_AOD. The first internal decoder 341 may generate the first internal precharge signal PG_A_OC at a logic high level, when the first internal clock CKA, the first decoding signal PCGA, and the first precharge alignment signal PG_AOD are all input as logic high levels.

The second internal decoder 342 may generate a second internal precharge signal PG_A_EC based on the first internal clock CKA, the first decoding signal PCGA, and the second precharge alignment signal PG_AEV. The second internal decoder 342 may generate the second internal precharge signal PG_A_EC at a logic high level, when the first internal clock CKA, the first decoding signal PCGA, and the second precharge alignment signal PG_AEV are all input as logic high levels.

The third internal decoder 343 may generate a third internal precharge signal PG_B_OC based on the second internal clock CKB, the second decoding signal PCGB, and the third precharge alignment signal PG_BOD. The third internal decoder 343 may generate the third internal precharge signal PG_B_OC at a logic high level, when the second internal clock CKB, the second decoding signal PCGB, and the third precharge alignment signal PG_BOD are all input as logic high levels.

The fourth internal decoder 344 may generate a fourth internal precharge signal PG_B_EC based on the second internal clock CKB, the second decoding signal PCGB, and the fourth precharge alignment signal PG_BEV. The fourth internal decoder 344 may generate the fourth internal precharge signal PG_B_EC at a logic high level, when the second internal clock CKB, the second decoding signal PCGB, and the fourth precharge alignment signal PG_BEV are all input as logic high levels.

The summing circuit 345 may generate the odd precharge command PCG_OD based on the first internal precharge signal PG_A_OC and the third internal precharge signal PG_B_OC. The summing circuit 345 may generate the odd precharge command PCG_OD by summing the first internal precharge signal PG_A_OC and the third internal precharge signal PG_B_OC. The summing circuit 345 may generate the even precharge command PCG_EV based on the second internal precharge signal PG_A_EC and the fourth internal precharge signal PG_B_EC. The summing circuit 345 may generate the even precharge command PCG_EV by summing the second internal precharge signal PG_A_EC and the fourth internal precharge signal PG_B_EC.

Figure 10:
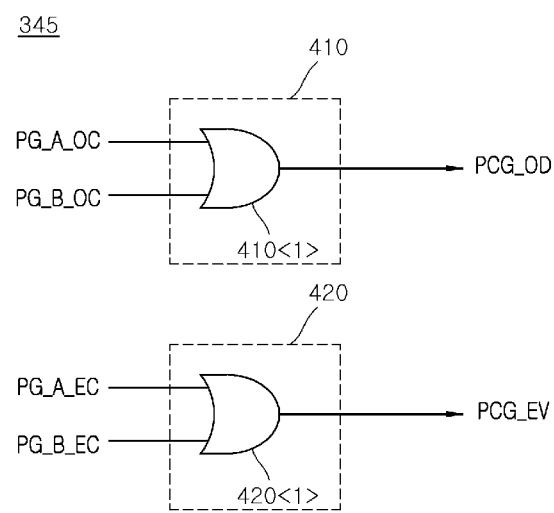
FIG. 10 is a circuit diagram illustrating a configuration of a summing circuit included in the precharge command generation circuit illustrated in FIG. 9.

FIG. 10 is a circuit diagram illustrating a configuration based on an example of the summing circuit 345 included in the precharge command generation circuit 340. The summing circuit 345 may include a first summing circuit 410 and a second summing circuit 420.

The first summing circuit 410 may be implemented as an OR gate 410<1>. The first summing circuit 410 may generate the odd precharge command PCG_OD by summing the first internal precharge signal PG_A_OC and the third internal precharge signal PG_B_OC. The first summing circuit 410 may generate the odd precharge command PCG_OD by performing an OR operation on the first internal precharge signal PG_A_OC and the third internal precharge signal PG_B_OC. The first summing circuit 410 may generate the odd precharge command PCG_OD at a logic high level when any one of the first internal precharge signal PG_A_OC and the third internal precharge signal PG_B_OC is input as a logic high level.

The second summing circuit 420 may be implemented as an OR gate 420<1>. The second summing circuit 420 may generate the even precharge command PCG_EV by summing the second internal precharge signal PG_A_EC and the fourth internal precharge signal PG_B_EC. The second summing circuit 420 may generate the even precharge command PCG_EV by performing an OR operation on the second internal precharge signal PG_A_EC and the fourth internal precharge signal PG_B_EC. The second summing circuit 420 may generate the even precharge command PCG_EV at a logic high level when any one of the second internal precharge signal PG_A_EC and the fourth internal precharge signal PG_B_EC is input as a logic high level.

Figure 11:
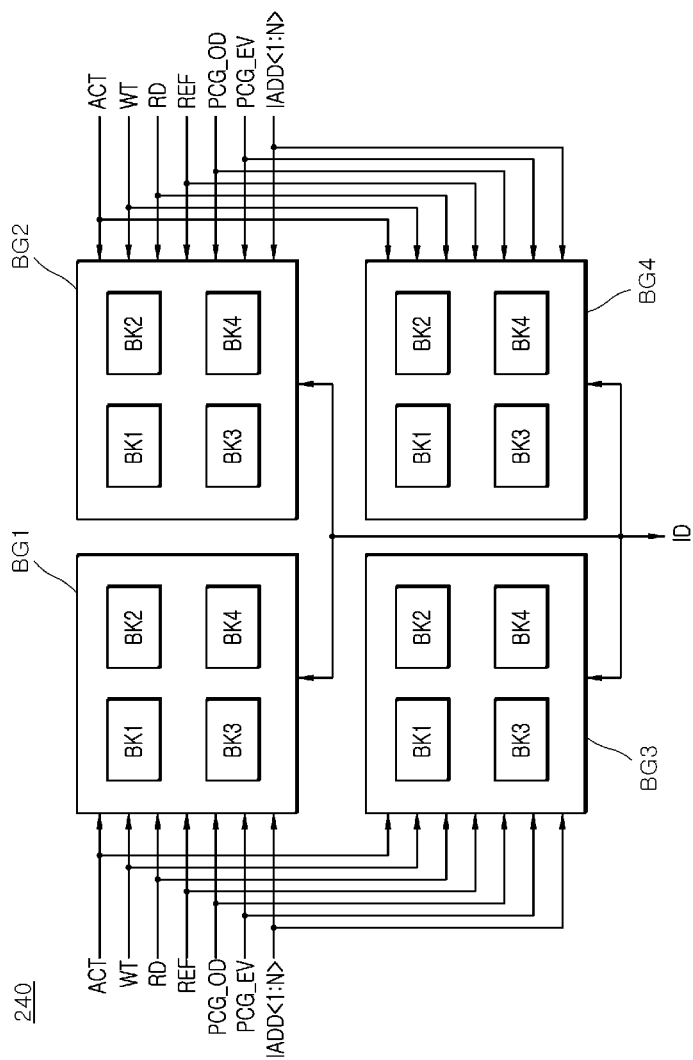
FIG. 11 is a block diagram illustrating a configuration of a core circuit included in the electronic device illustrated in FIG. 2.

FIG. 11 is a block diagram illustrating a configuration based on an example of the core circuit 240 included in the electronic device 20. The core circuit 240 may include the first bank group BG1, the second bank group BG2, the third bank group BG3, and the fourth bank group BG4.

The first bank group BG1 may include the first bank BK1, the second bank BK2, the third bank BK3, and the fourth bank BK4.

The first bank group BG1 may perform an active operation of activating the word lines (WL of FIG. 12) included in the first to fourth banks BK1 to BK4 according to the first to Nth internal address signals IADD<1:N>, when the active command ACT is input. The first bank group BG1 may perform a write operation of storing the internal data ID, loaded on the bit line pair (BL,/BL of FIG. 12) included in the first to fourth banks BK1 to BK4, in the memory cell (MC of FIG. 12) according to the first to Nth internal address signals IADD<1:N>, when the write command WT is input. The first bank group BG1 may perform a read operation of outputting the internal data ID stored in the memory cell (MC of FIG. 12) to the bit line pair (BL,/BL of FIG. 12) included in the first to fourth banks BK1 to BK4, according to the first to Nth internal address signals IADD<1:N>, when the read command RD is input. The first bank group BG1 may perform a refresh operation by sequentially activating the word lines (WL of FIG. 12) according to the first to Nth internal address signals IADD<1:N>, when the refresh command REF is input. The first bank group BG1 may perform the precharge operation on a region selected by the first to Nth internal address signals IADD<1:N> when any one of the odd precharge command PCG_ODD and the even precharge command PCG_EV is input.

Because the second to fourth bank groups BG2 to BG4 are configured in the same manner as the first bank group BG1 and perform the same operation as the first bank group BG1, the detailed descriptions thereof will be omitted herein. The first to fourth banks BK1 to BK4 included in the first bank group BG1, the first to fourth banks BK1 to BK4 included in the second bank group BG2, the first to fourth banks BK1 to BK4 included in the third bank group BG3, and the first to fourth banks BK1 to BK4 included in the fourth bank group BG4 may be respectively set to the banks at the same positions. For example, the first bank BK1 of the first bank group BG1 indicates a bank at the same position as the first bank BK1 of the second bank group BG2.

Figure 12:
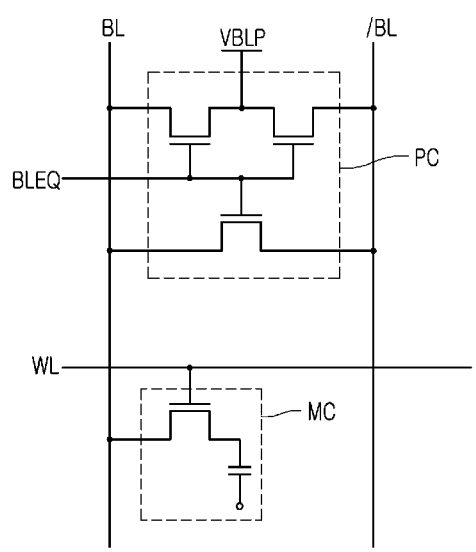
FIG. 12 is a circuit diagram illustrating a configuration based on an example of a memory cell and a precharge circuit which are included in a bank illustrated in FIG. 11.

FIG. 12 is a circuit diagram illustrating a configuration based on an example of the memory cell MC and a precharge circuit PC, which are included in each of the first to fourth banks BK1 to BK4.

The memory cell MC may be coupled to the word line WL and the bit line pair BL,/BL. The word line WL coupled to the memory cell MC may be driven by the first to Nth internal address signals IADD<1:N> during the active operation. The bit line pair BL,/BL coupled to the memory cell MC may be driven by the first to Nth internal address signals IADD<1:N>, and may store the internal data ID in the memory cell MC, during the write operation. The bit line pair BL,/BL coupled to the memory cell MC may be driven by the first to Nth internal address signals IADD<1:N>, and may output the internal data ID stored in the memory cell MC, during the read operation. The word line WL coupled to the memory cell MC may be driven by the first to Nth internal address signals IADD<1:N> during the refresh operation.

The precharge circuit PC may be coupled to the bit line pair BL,/BL. The precharge circuit PC may couple the bit line BL and the bit line/BL according to an equalization signal BLEQ during the precharge operation. The precharge circuit PC may drive the bit line BL and the bit line/BL to the bit line precharge voltage VBLP during the precharge operation. The equalization signal BLEQ may be set to a signal which is generated at a logic high level during the precharge operation. The bit line precharge voltage VBLP may be set to a voltage having a voltage level corresponding to ½ of a power supply voltage used in the core circuit 240.

The memory cell MC and the precharge circuit PC, illustrated in FIG. 12, may be implemented as a plurality of memory cells MC and a plurality of precharge circuits PC, which constitute a memory cell array in each of the first to fourth banks BK1 to BK4.

Figure 13:
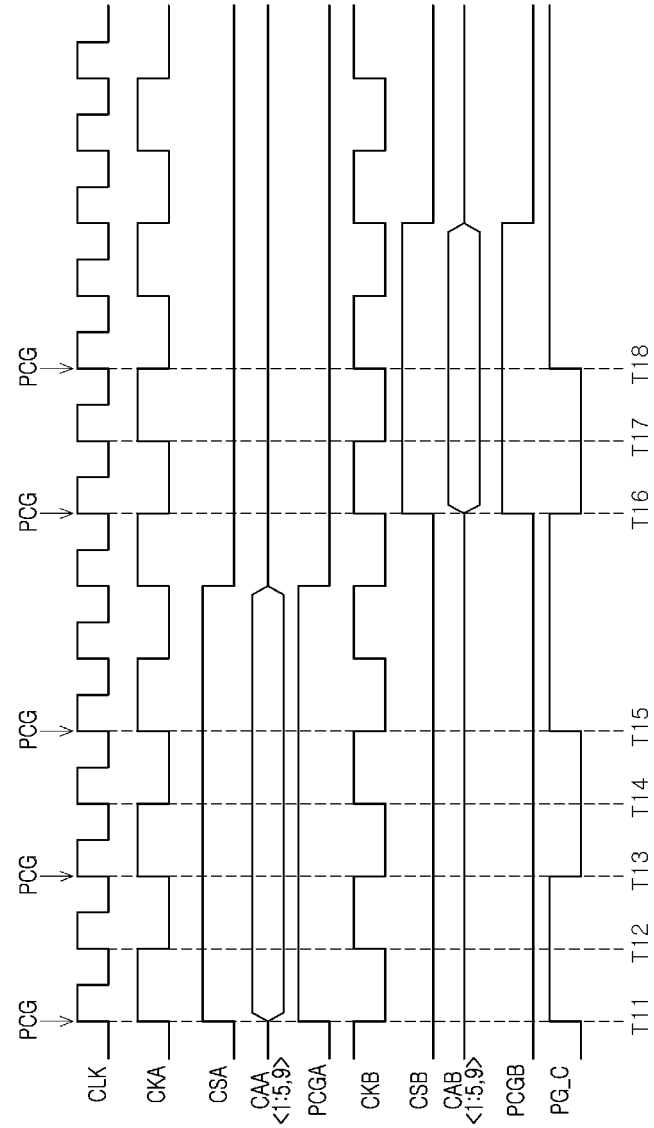
FIGS. 13 and 14 are timing diagrams for describing an operation of the semiconductor system in accordance with the present embodiment.
Figure 14:
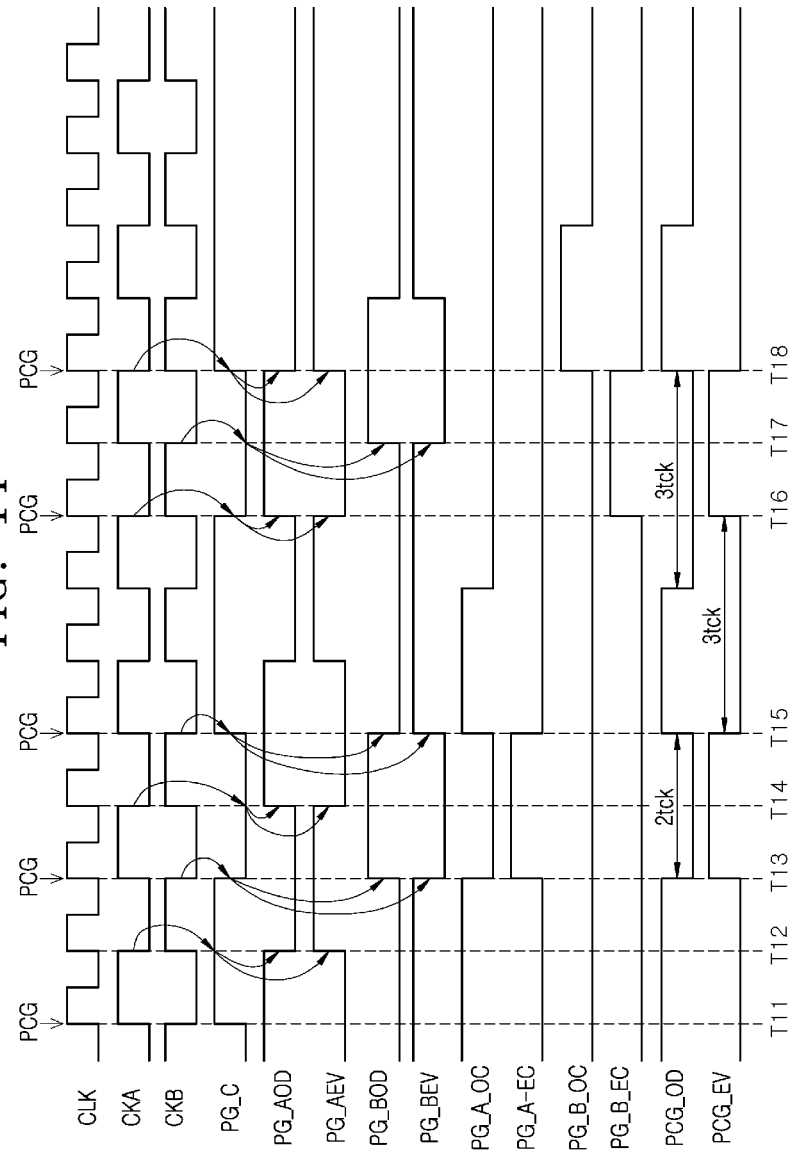

Referring to FIGS. 13 and 14, the precharge operation of the semiconductor system 1 in accordance with the present embodiment will be described. In the following descriptions, there will be exemplified an operation in which the chip selection signal CS, the first to fifth command/address signals CA<1:5>, and the ninth command/address signal CA<9> for performing the precharge operation PCG are consecutively input in synchronization with the first internal clock CKA, and an operation in which the chip selection signal CS, the first to fifth command/address signals CA<1:5>, and the ninth command/address signal CA<9> for performing the precharge operation PCG are consecutively input in synchronization with the second internal clock CKB, after the chip selection signal CS, the first to fifth command/address signals CA<1:5>, and the ninth command/address signal CA<9> for performing the precharge operation PCG are input in synchronization with the first internal clock CKA.

First, the operation will be described as follows, in which the chip selection signal CS, the first to fifth command/address signals CA<1:5>, and the ninth command/address signal CA<9> for performing the precharge operation PCG are consecutively input in synchronization with the first internal clock CKA.

At time T11, the controller 10 outputs the clock CLK, the chip selection signal CS, and the first to ninth command/address signals CA<1:9> for controlling the precharge operation PCG of the electronic device 20.

The clock divider circuit 210 generates the first internal clock CKA and the second internal clock CKB, which are out of phase with one another, and by dividing the frequency of the clock CLK the first and second internal clocks CKA and CKB may be, for example, 180 degrees out of phase with one another.

The input circuit 221 latches the chip selection signal CS in synchronization with the first internal clock CKA, and generates the odd chip selection signal CSA by inverting the latched chip selection signal CS. The input circuit 221 generates the first to fifth odd command/address signals CAA<1:5> and the ninth odd command/address signal CAA<9> by latching the first to fifth command/address signals CA<1:5> and the ninth command/address signal CA<9>, in synchronization with the first internal clock CKA. The chip selection signal CS, the first to fifth command/address signals CA<1:5>, and the ninth command/address signal CA<9>, which are input at time T11, are input in synchronization with a rising edge of the first internal clock CKA.

The pre-decoder 310 generates the first decoding signal PCGA, when the first to fifth odd command/address signals CAA<1:5> and the ninth odd command/address signal CAA<9> have a logic level combination for performing the first to third precharge operations, in synchronization with the first internal clock CKA.

The counting circuit 320 generates the counting signal PG_C which is toggled in synchronization with a rising edge of the first internal clock CKA in a period in which the odd chip selection signal CSA and the first decoding signal PCGA are input.

The first internal decoder 341 generates the first internal precharge signal PG_A_OC at a logic high level, when the first internal clock CKA, the first decoding signal PCGA, and the first precharge alignment signal PG_AOD are all input as logic high levels.

At time T12, the first latch circuit 331 latches the counting signal PG_C in synchronization with a falling edge of the first internal clock CKA, generates the first precharge alignment signal PG_AOD at a logic low level by inverting the latched counting signal PG_C, and generates the second precharge alignment signal PG_AEV at a logic high level by inverting the first precharge alignment signal PG_AOD.

At time T13, the controller 10 outputs the clock CLK, the chip selection signal CS, and the first to ninth command/address signals CA<1:9> for controlling the precharge operation PCG of the electronic device 20.

The clock divider circuit 210 generates the first internal clock CKA and the second internal clock CKB, which are out of phase with one another, and by dividing the frequency of the clock CLK the first and second internal clocks CKA and CKB may be, for example, 180 degrees out of phase with one another.

The input circuit 221 latches the chip selection signal CS in synchronization with the first internal clock CKA, and generates the odd chip selection signal CSA by inverting the latched chip selection signal CS. The input circuit 221 generates the first to fifth odd command/address signals CAA<1:5> and the ninth odd command/address signal CAA<9> by latching the first to fifth command/address signals CA<1:5> and the ninth command/address signal CA<9> in synchronization with the first internal clock CKA. The chip selection signal CS, the first to fifth command/address signals CA<1:5>, and the ninth command/address signal CA<9>, which are input at time T13, are input in synchronization with a rising edge of the first internal clock CKA.

The pre-decoder 310 generates the first decoding signal PCGA, when the first to fifth odd command/address signals CAA<1:5> and the ninth odd command/address signal CAA<9> have a logic level combination for performing the first to third precharge operations, in synchronization with the first internal clock CKA.

The counting circuit 320 generates the counting signal PG_C which is toggled in synchronization with a rising edge of the first internal clock CKA during a period in which the odd chip selection signal CSA and the first decoding signal PCGA are input.

The second latch circuit 332 latches the counting signal PG_C in synchronization with a falling edge of the second internal clock CKB, generates the third precharge alignment signal PG_BOD at a logic high level by inverting the latched counting signal PG_C, and generates the fourth precharge alignment signal PG_BEV at a logic low level by inverting the third precharge alignment signal PG_BOD.

The first internal decoder 341 generates the first internal precharge signal PG_A_OC at a logic low level, when the first precharge alignment signal PG_AOD is input as a logic low level.

The second internal decoder 342 generates the second internal precharge signal PG_A_EC at a logic high level, when the first internal clock CKA, the first decoding signal PCGA, and the second precharge alignment signal PG_AEV are all input as logic high levels.

The third internal decoder 343 generates the third internal precharge signal PG_B_OC at a logic low level, when the second decoding signal PCGB is input as a logic low level.

The fourth internal decoder 344 generates the fourth internal precharge signal PG_B_EC at a logic low level, when the second decoding signal PCGB is input as a logic low level.

The first summing circuit 410 generates the odd precharge command PCG_OD at a logic low level by summing the first internal precharge signal PG_A_OC and the third internal precharge signal PG_B_OC.

The second summing circuit 420 generates the even precharge command PCG_EV at a logic high level by summing the second internal precharge signal PG_A_EC and the fourth internal precharge signal PG_B_EC.

At time T14, the first latch circuit 331 latches the counting signal PG_C in synchronization with a falling edge of the first internal clock CKA, generates the first precharge alignment signal PG_AOD at a logic high level by inverting the latched counting signal PG_C, and generates the second precharge alignment signal PG_AEV at a logic low level by inverting the first precharge alignment signal PG_AOD.

At time T15, the controller 10 outputs the clock CLK, the chip selection signal CS, and the first to ninth command/address signals CA<1:9> for controlling the precharge operation PCG of the electronic device 20.

The clock divider circuit 210 generates the first internal clock CKA and the second internal clock CKB, which are out of phase with one another, and by dividing the frequency of the clock CLK the first and second internal clocks CKA and CKB may be, for example, 180 degrees out of phase with one another.

The input circuit 221 latches the chip selection signal CS in synchronization with the first internal clock CKA, and generates the odd chip selection signal CSA by inverting the latched chip selection signal CS. The input circuit 221 generates the first to fifth odd command/address signals CAA<1:5> and the ninth odd command/address signal CAA<9> by latching the first to fifth command/address signals CA<1:5> and the ninth command/address signal CA<9> in synchronization with the first internal clock CKA. The chip selection signal CS, the first to fifth command/address signals CA<1:5>, and the ninth command/address signal CA<9>, which are input at time T15, are input in synchronization with a rising edge of the first internal clock CKA.

The pre-decoder 310 generates the first decoding signal PCGA, when the first to fifth odd command/address signals CAA<1:5> and the ninth odd command/address signal CAA<9> have a logic level combination for performing the first to third precharge operations, in synchronization with the first internal clock CKA.

The counting circuit 320 generates the counting signal PG_C which is toggled in synchronization with a rising edge of the first internal clock CKA during a period in which the odd chip selection signal CSA and the first decoding signal PCGA are input.

The second latch circuit 332 latches the counting signal PG_C in synchronization with a falling edge of the second internal clock CKB, generates the third precharge alignment signal PG_BOD at a logic low level by inverting the latched counting signal PG_C, and generates the fourth precharge alignment signal PG_BEV at a logic high level by inverting the third precharge alignment signal PG_BOD.

The first internal decoder 341 generates the first internal precharge signal PG_A_OC at a logic high level, when the first internal clock CKA, the first decoding signal PCGA, and the first precharge alignment signal PG_AOD are all input as logic high levels.

The second internal decoder 342 generates the second internal precharge signal PG_A_EC at a logic low level, when the second precharge alignment signal PG_AEV is input as a logic low level.

The third internal decoder 343 generates the third internal precharge signal PG_B_OC at a logic low level, when the second decoding signal PCGB is input as a logic low level.

The fourth internal decoder 344 generates the fourth internal precharge signal PG_B_EC at a logic low level, when the second decoding signal PCGB is input as a logic low level.

The first summing circuit 410 generates the odd precharge command PCG_OD at a logic high level by summing the first internal precharge signal PG_A_OC and the third internal precharge signal PG_B_OC.

The second summing circuit 420 generates the even precharge command PCG_EV at a logic low level by summing the second internal precharge signal PG_A_EC and the fourth internal precharge signal PG_B_EC.

The electronic device 20 in accordance with the present embodiment may generate the pulses of the odd precharge command PCG_OD and the even precharge command PCG_EV as pulses each corresponding to two periods (2tck) or more of the clock CLK, when the command/address signals for performing the precharge operation are consecutively input, thereby preventing or mitigating the pulses of the odd and even precharge commands PCG_OD and PCG_EV from being merged even though loadings of the command transmission lines are changed. The electronic device 20 in accordance with the present embodiment may generate the pulses of the precharge command as pulses each corresponding to two periods (2tck) or more of the clock when the command/address signals for performing the precharge operation are consecutively input, thereby preventing or mitigating a precharge operation error.

Next, the operation will be described as follows, in which the chip selection signal CS, the first to fifth command/address signals CA<1:5>, and the ninth command/address signal CA<9> for performing the precharge operation PCG are consecutively input in synchronization with the second internal clock CKB, after the chip selection signal CS, the first to fifth command/address signals CA<1:5>, and the ninth command/address signal CA<9> for performing the precharge operation PCG are input in synchronization with the first internal clock CKA.

At time T16, the controller 10 outputs the clock CLK, the chip selection signal CS, and the first to ninth command/address signals CA<1:9> for controlling the precharge operation PCG of the electronic device 20.

The clock divider circuit 210 generates the first internal clock CKA and the second internal clock CKB, which are out of phase with one another, and by dividing the frequency of the clock CLK the first and second internal clocks CKA and CKB may be, for example, 180 degrees out of phase with one another.

The input circuit 221 latches the chip selection signal CS in synchronization with the second internal clock CKB, and generates the even chip selection signal CSB by inverting the latched chip selection signal CS. The input circuit 221 generates the first to fifth even command/address signals CAB<1:5> and the ninth even command/address signal CAB<9> by latching the first to fifth command/address signals CA<1:5> and the ninth command/address signal CA<9> in synchronization with the second internal clock CKB. The chip selection signal CS, the first to fifth command/address signals CA<1:5>, and the ninth command/address signal CA<9>, which are input at time T16, are input in synchronization with a rising edge of the second internal clock CKB.

The pre-decoder 310 generates the second decoding signal PCGB when the first to fifth even command/address signals CAB<1:5> and the ninth even command/address signal CAB<9> have a logic level combination for performing the first to third precharge operations, in synchronization with the second internal clock CKB.

The counting circuit 320 generates the counting signal PG_C which is toggled in synchronization with a rising edge of the second internal clock CKB during a period in which the even chip selection signal CSB and the second decoding signal PCGB are input.

The first latch circuit 331 latches the counting signal PG_C in synchronization with a falling edge of the first internal clock CKA, generates the first precharge alignment signal PG_AOD at a logic high level by inverting the latched counting signal PG_C, and generates the second precharge alignment signal PG_AEV at a logic low level by inverting the first precharge alignment signal PG_AOD.

The first internal decoder 341 generates the first internal precharge signal PG_A_OC at a logic low level, when the first decoding signal PCGA is input as a logic low level.

The second internal decoder 342 generates the second internal precharge signal PG_A_EC at a logic low level, when the first decoding signal PCGA is input as a logic low level.

The third internal decoder 343 generates the third internal precharge signal PG_B_OC at a logic low level, when the third precharge alignment signal PG_BOD is input as a logic low level.

The fourth internal decoder 344 generates the fourth internal precharge signal PG_B_EC at a logic high level, when the second internal clock CKB, the second decoding signal PCGB, and the fourth precharge alignment signal PG_BEV are all input as logic high levels.

The first summing circuit 410 generates the odd precharge command PCG_OD at a logic low level by summing the first internal precharge signal PG_A_OC and the third internal precharge signal PG_B_OC.

The second summing circuit 420 generates the even precharge command PCG_EV at a logic high level by summing the second internal precharge signal PG_A_EC and the fourth internal precharge signal PG_B_EC.

At time T17, the second latch circuit 332 latches the counting signal PG_C in synchronization with a falling edge of the second internal clock CKB, generates the third precharge alignment signal PG_BOD at a logic high level by inverting the latched counting signal PG_C, and generates the fourth precharge alignment signal PG_BEV at a logic low level by inverting the third precharge alignment signal PG_BOD.

At time T18, the controller 10 outputs the clock CLK, the chip selection signal CS, and the first to ninth command/address signals CA<1:9> for controlling the precharge operation PCG of the electronic device 20.

The clock divider circuit 210 generates the first internal clock CKA and the second internal clock CKB, which are out of phase with one another, and by dividing the frequency of the clock CLK the first and second internal clocks CKA and CKB may be, for example, 180 degrees out of phase with one another.

The input circuit 221 latches the chip selection signal CS in synchronization with the second internal clock CKB, and generates the even chip selection signal CSB by inverting the latched chip selection signal CS. The input circuit 221 generates the first to fifth even command/address signals CAB<1:5> and the ninth even command/address signal CAB<9> by latching the first to fifth command/address signals CA<1:5> and the ninth command/address signal CA<9> in synchronization with the second internal clock CKB. The chip selection signal CS, the first to fifth command/address signals CA<1:5>, and the ninth command/address signal CA<9>, which are input at time T18, are input in synchronization with a rising edge of the second internal clock CKB.

The pre-decoder 310 generates the second decoding signal PCGB when the first to fifth even command/address signals CAB<1:5> and the ninth even command/address signal CAB<9> have a logic level combination for performing the first to third precharge operations, in synchronization with the second internal clock CKB.

The counting circuit 320 generates the counting signal PG_C which is toggled in synchronization with a rising edge of the second internal clock CKB during a period in which the even chip selection signal CSB and the second decoding signal PCGB are input.

The first latch circuit 331 latches the counting signal PG_C in synchronization with a falling edge of the first internal clock CKA, generates the first precharge alignment signal PG_AOD at a logic low level by inverting the latched counting signal PG_C, and generates the second precharge alignment signal PG_AEV at a logic high level by inverting the first precharge alignment signal PG_AOD.

The first internal decoder 341 generates the first internal precharge signal PG_A_OC at a logic low level, when the first decoding signal PCGA is input as a logic low level.

The second internal decoder 342 generates the second internal precharge signal PG_A_EC at a logic low level, when the first decoding signal PCGA is input as a logic low level.

The third internal decoder 343 generates the third internal precharge signal PG_B_OC at a logic high level, when the second internal clock CKB, the second decoding signal PCGB, and the third precharge alignment signal PG_BOD are all input as logic high levels.

The fourth internal decoder 344 generates the fourth internal precharge signal PG_B_EC at a logic low level, when the fourth precharge alignment signal PG_BEV is input as a logic low level.

The first summing circuit 410 generates the odd precharge command PCG_OD at a logic high level by summing the first internal precharge signal PG_A_OC and the third internal precharge signal PG_B_OC.

The second summing circuit 420 generates the even precharge command PCG_EV at a logic low level by summing the second internal precharge signal PG_A_EC and the fourth internal precharge signal PG_B_EC.

The electronic device 20 in accordance with the present embodiment may generate the pulses of the odd and even precharge commands PCG_OD and PCG_EV as pulses each corresponding to three periods (3tck) or more of the clock CLK, when the command/address signals for performing the precharge operation are consecutively input, thereby preventing or mitigating the pulses of the odd and even precharge commands PCG_OD and PCG_EV from being merged even though loadings of the command transmission lines are changed. The electronic device 20 in accordance with the present embodiment may generate the pulses of the precharge command as pulses each corresponding to three periods (3tck) or more of the clock when the command/address signals for performing the precharge operation are consecutively input, thereby preventing or mitigating a precharge operation error.

Figure 15:
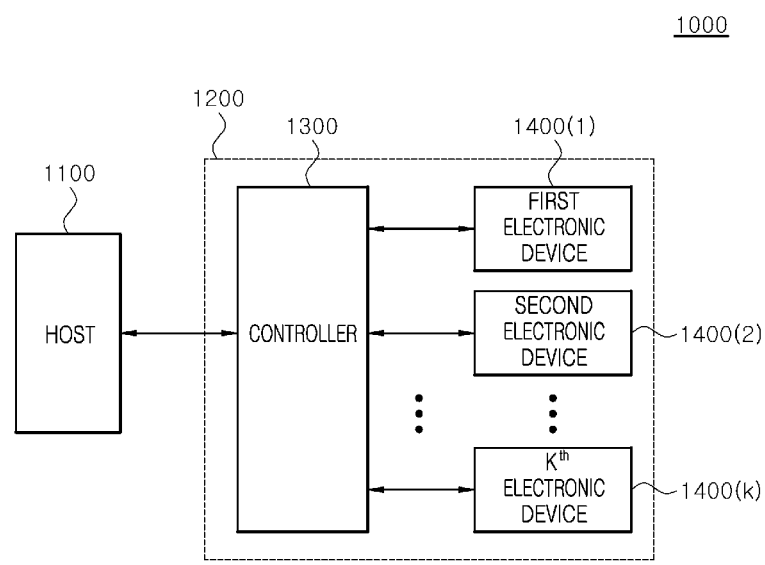
FIG. 15 is a diagram illustrating a configuration of an electronic system in accordance with an embodiment, to which the semiconductor system illustrated in FIGS. 1 to 14 is applied.

FIG. 15 is a block diagram illustrating a configuration of an electronic system 1000 in accordance with an embodiment. As illustrated in FIG. 15, the electronic system 1000 may include a host 1100 and a semiconductor system 1200.

The host 1100 and the semiconductor system 1200 may transmit/receive signals to/from each other by using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect-Express), ATA (Advanced Technology Attachment), SATA (Serial ATA), PATA (Parallel ATA), SAS (Serial Attached SCSI), USB (Universal Serial Bus) and the like.

The semiconductor system 1200 may include a controller 1300 and electronic devices 1400(K:1). The controller 1300 may apply, to the electronic devices 1400(K:1), a chip selection signal CS and command/address signals for controlling the operations of the electronic devices 1400(K:1). When the command/address signals for performing a precharge operation are consecutively input, in an embodiment, each of the electronic devices 1400(K:1) may generate the pulses of a precharge command as pulses each corresponding to two periods (2tck) or more of a clock, thereby preventing or mitigating the pulses of the precharge command from being merged even though the loadings of command transmission lines are changed. When the command/address signals for performing the precharge operation are consecutively input, in an embodiment, each of the electronic devices 1400(K:1) may generate the pulses of the precharge command as pulses each corresponding to two periods (2tck) or more of the clock, thereby preventing or mitigating a precharge operation error.

The controller 1300 may be implemented as the controller 10 illustrated in FIG. 1. The electronic devices 1400(K:1) may be each implemented as the electronic device 20 illustrated in FIGS. 1 and 2. In an embodiment, the electronic devices 1400(K:1) may be each implemented as one of a DRAM (dynamic random access memory), PRAM (Phase change Random Access Memory), RRAM (Resistive Random Access Memory), MRAM (Magnetic Random Access Memory) and FRAM (Ferroelectric Random Access Memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. An electronic device comprising:
    a clock divider circuit configured to:
        generate a first internal clock including pulses which are generated in synchronization with odd pulses of a clock, and
        generate a second internal clock including pulses which are generated in synchronization with even pulses of the clock; and
    a command decoder configured to generate an odd precharge command and an even precharge command based on a counting signal which is toggled by a chip selection signal and a command and address (command/address) signal for performing a precharge operation in synchronization with the first internal clock or toggled by the chip selection signal and the command/address signal for performing the precharge operation in synchronization with the second internal clock,
    wherein the command decoder is configured to:
        generate a pulse of the odd precharge command as a pulse corresponding to two or more periods of the clock, and
        generate a pulse of the even precharge command as a pulse corresponding to two or more periods of the clock.

2. The electronic device of claim 1, wherein the command decoder is configured to generate, as a pulse corresponding to three or more periods of the clock, a pulse of the odd precharge command which is generated from the command/address signal input in synchronization with the first internal clock and a pulse of the odd precharge command which is generated from the command/address signal input in synchronization with the second internal clock,
    wherein the command decoder is configured to generate, as a pulse corresponding to three or more periods of the clock, a pulse of the even precharge command which is generated from the command/address signal input in synchronization with the first internal clock and a pulse of the even precharge command which is generated from the command/address signal input in synchronization with the second internal clock.

3. The electronic device of claim 1, wherein the command decoder is configured to output the odd precharge command to a core circuit through a first command transmission line, and output the even precharge command to the core circuit through a second command transmission line.

4. The electronic device of claim 3, wherein the core circuit is configured to perform the precharge operation on a region selected by an internal address signal generated from the command/address signal, when any one of the odd precharge command and the even precharge command is input.

5. The electronic device of claim 1, wherein the command decoder comprises:
    an input circuit configured to:
        generate an odd chip selection signal and an odd command/address signal based on the chip selection signal and the command/address signal in synchronization with the first internal clock, and generate an even chip selection signal and an even command/address signal from the chip selection signal and the command/address signal in synchronization with the second internal clock; and a precharge decoder configured to generate the odd precharge command and the even precharge command based on the odd chip selection signal and the odd command/address signal and the even chip selection signal and the even command/address signal, in synchronization with the first internal clock and the second internal clock.

6. The electronic device of claim 5, wherein the precharge decoder comprises:

a pre-decoder configured to:

generate a first decoding signal when the odd command/address signal has a logic level combination for performing the precharge operation in synchronization with the first internal clock, and generate a second decoding signal when the even command/address signal has a logic level combination for performing the precharge operation in synchronization with the second internal clock;

a counting circuit configured to generate the counting signal which is toggled in synchronization with a rising edge of the first internal clock during a period in which the odd chip selection signal and the first decoding signal are input, and toggled in synchronization with a rising edge of the second internal clock during a period in which the even chip selection signal and the second decoding signal are input;

an alignment circuit configured to:

generate a first precharge alignment signal and a second precharge alignment signal by latching the counting signal in synchronization with a falling edge of the first internal clock, and generate a third precharge alignment signal and a fourth precharge alignment signal by latching the counting signal in synchronization with a falling edge of the second internal clock; and a precharge command generation circuit configured to:

generate the odd precharge command based on the first decoding signal and the first and third precharge alignment signals in synchronization with a rising edge of the first internal clock, and generate the even precharge command based on the second decoding signal and the second and fourth precharge alignment signals in synchronization with a rising edge of the second internal clock.

7. The electronic device of claim 6, wherein the counting circuit comprises:

a logic circuit configured to generate a pulse signal when the odd chip selection signal, the first decoding signal, and the first internal clock are input or when the even chip selection signal, the second decoding signal, and the second internal clock are input; and a counter configured to generate the counting signal which is toggled in synchronization with a pulse of the pulse signal.

8. The electronic device of claim 6, wherein the alignment circuit comprises:

a first latch circuit configured to:

generate the first precharge alignment signal by latching the counting signal in synchronization with a falling edge of the first internal clock, and generate the second precharge alignment signal by inverting the first precharge alignment signal; and a second latch circuit configured to:

generate the third precharge alignment signal by latching the counting signal in synchronization with a falling edge of the second internal clock, and generate the fourth precharge alignment signal by inverting the third precharge alignment signal.

9. The electronic device of claim 6, wherein the precharge command generation circuit comprises:

a first internal decoder configured to generate a first internal precharge signal when the first internal clock, the first decoding signal, and the first precharge alignment signal are input;

a second internal decoder configured to generate a second internal precharge signal when the first internal clock, the first decoding signal, and the second precharge alignment signal are input;

a third internal decoder configured to generate a third internal precharge signal when the second internal clock, the second decoding signal, and the third precharge alignment signal are input;

a fourth internal decoder configured to generate a fourth internal precharge signal when the second internal clock, the second decoding signal, and the fourth precharge alignment signal are input; and a summing circuit configured to:

generate the odd precharge command based on the first internal precharge signal and the third internal precharge signal, and generate the even precharge command based on the second internal precharge signal and the fourth internal precharge signal.

10. The electronic device of claim 9, wherein the summing circuit comprises:

a first summing circuit configured to generate the odd precharge command by summing the first internal precharge signal and the third internal precharge signal; and a second summing circuit configured to generate the even precharge command by summing the second internal precharge signal and the fourth internal precharge signal.

11. An electronic device comprising:

a command decoder configured to generate an odd precharge command and an even precharge command based on a counting signal which is toggled by a chip selection signal and a command and address (command/address) signal for performing a first precharge operation and a second precharge operation in synchronization with a first internal clock or toggled by the chip selection signal and the command/address signal for performing the first and second precharge operations in synchronization with a second internal clock; and a core circuit configured to:

perform the first precharge operation on banks at the same positions, which are included in a first bank group and a second bank group, according to an internal address signal generated from the command/address signal when any one of the odd precharge command and the even precharge command is input, or perform the second precharge operation on one of a plurality of banks included in the first and second bank groups according to the internal address signal generated from the command/address signal when any one of the odd precharge command and the even precharge command is input, wherein the command decoder is configured to:

generate a pulse of the odd precharge command as a pulse corresponding to two or more periods of a clock, and generate a pulse of the even precharge command as a pulse corresponding to two or more periods of the clock.

12. The electronic device of claim 11, wherein the command decoder is configured to generate, as a pulse corresponding to three or more periods of the clock, a pulse of the odd precharge command which is generated from the command/address signal input in synchronization with the first internal clock and a pulse of the odd precharge command which is generated from the command/address signal input in synchronization with the second internal clock, wherein the command decoder is configured to generate, as a pulse corresponding to three or more periods of the clock, a pulse of the even precharge command which is generated from the command/address signal input in synchronization with the first internal clock and a pulse of the even precharge command which is generated from the command/address signal input in synchronization with the second internal clock.

13. The electronic device of claim 11, wherein the command decoder comprises:

an input circuit configured to:

generate an odd chip selection signal and an odd command/address signal based on the chip selection signal and the command/address signal in synchronization with the first internal clock, and generate an even chip selection signal and an even command/address signal from the chip selection signal and the command/address signal in synchronization with the second internal clock; and a precharge decoder configured to generate the odd precharge command and the even precharge command based on the odd chip selection signal and the odd command/address signal and the even chip selection signal and the even command/address signal, in synchronization with the first internal clock and the second internal clock.

14. The electronic device of claim 13, wherein the precharge decoder comprises:

a pre-decoder configured to:

generate a first decoding signal when the odd command/address signal has a logic level combination for performing the first and second precharge operations in synchronization with the first internal clock, and generate a second decoding signal when the even command/address signal has a logic level combination for performing the first and second precharge operations in synchronization with the second internal clock;

a counting circuit configured to generate the counting signal which is toggled in synchronization with a rising edge of the first internal clock during a period in which the odd chip selection signal and the first decoding signal are input, and toggled in synchronization with a rising edge of the second internal clock during a period in which the even chip selection signal and the second decoding signal are input;

an alignment circuit configured to:

generate a first precharge alignment signal and a second precharge alignment signal by latching the counting signal in synchronization with a falling edge of the first internal clock, and generate a third precharge alignment signal and a fourth precharge alignment signal by latching the counting signal in synchronization with a falling edge of the second internal clock; and a precharge command generation circuit configured to:

generate the odd precharge command based on the first decoding signal and the first and third precharge alignment signals in synchronization with a rising edge of the first internal clock, and generate the even precharge command based on the second decoding signal and the second and fourth precharge alignment signals in synchronization with a rising edge of the second internal clock.

15. The electronic device of claim 14, wherein the counting circuit comprises:

a logic circuit configured to generate a pulse signal when the odd chip selection signal, the first decoding signal, and the first internal clock are input or when the even chip selection signal, the second decoding signal, and the second internal clock are input; and a counter configured to generate the counting signal which is toggled in synchronization with a pulse of the pulse signal.

16. The electronic device of claim 14, wherein the alignment circuit comprises:

a first latch circuit configured to:

generate the first precharge alignment signal by latching the counting signal in synchronization with a falling edge of the first internal clock, and generate the second precharge alignment signal by inverting the first precharge alignment signal; and a second latch circuit configured to:

generate the third precharge alignment signal by latching the counting signal in synchronization with a falling edge of the second internal clock, and generate the fourth precharge alignment signal by inverting the third precharge alignment signal.

17. The electronic device of claim 14, wherein the precharge command generation circuit comprises:

a first internal decoder configured to generate a first internal precharge signal when the first internal clock, the first decoding signal, and the first precharge alignment signal are input;

a second internal decoder configured to generate a second internal precharge signal when the first internal clock, the first decoding signal, and the second precharge alignment signal are input;

a third internal decoder configured to generate a third internal precharge signal when the second internal clock, the second decoding signal, and the third precharge alignment signal are input;

a fourth internal decoder configured to generate a fourth internal precharge signal when the second internal clock, the second decoding signal, and the fourth precharge alignment signal are input; and a summing circuit configured to:

generate the odd precharge command based on the first internal precharge signal and the third internal precharge signal, and generate the even precharge command based on the second internal precharge signal and the fourth internal precharge signal.

18. The electronic device of claim 11, wherein the core circuit comprises:
- a first bank group comprising a first bank and a second bank; and
- a second bank group comprising a third bank and a fourth bank,
- wherein the core circuit is configured to:
  - perform the first precharge operation on any one of the first and third banks included in the first and second bank groups and any one of the second and fourth banks included in the first and second bank groups, according to the internal address signal during the first precharge operation, and
  - perform the second precharge operation on any one of the first to fourth banks included in the first and second bank groups according to the internal address signal during the second precharge operation.

19. The electronic device of claim 11, wherein the command decoder is configured to generate the odd precharge command and the even precharge command from a first group included in the command/address signal.

20. The electronic device of claim 11, further comprising an address decoder configured to:
- generate the internal address signal having a logic level combination for selecting banks at the same positions, included in the first and second bank groups, from a second group included in the command/address signal during the first precharge operation,
- generate the internal address signal having a logic level combination for selecting banks at the same positions, included in the first and second bank groups, from the second group included in the command/address signal during the second precharge operation.

* * * * *